United States Patent [19]

Slamecka

[11] 4,168,463
[45] Sep. 18, 1979

[54] ARRANGEMENT FOR THE SYNTHETIC TESTING OF TRIPOLAR HIGH-VOLTAGE CIRCUIT BREAKERS

[75] Inventor: Ernst Slamecka, Berlin, Fed. Rep. of Germany

[73] Assignee: Siemens Aktiengesellschaft, Munich and Berlin, Fed. Rep. of Germany

[21] Appl. No.: 877,864

[22] Filed: Feb. 15, 1978

[30] Foreign Application Priority Data

Mar. 22, 1977 [DE] Fed. Rep. of Germany ....... 2713123

[51] Int. Cl.² ............................................. G01R 31/02
[52] U.S. Cl. .............................. 324/28 CB; 324/28 R
[58] Field of Search ............ 324/28 R, 28 CB, 28 CR

[56] References Cited

U.S. PATENT DOCUMENTS

| 3,398,357 | 8/1968 | Colclaser, Jr. .................. 324/28 CB |
| 3,739,259 | 6/1973 | May ................................. 324/28 CB |

OTHER PUBLICATIONS

R. Bitsch F. Richter, Performance testing of a three-phase encapsulated SF$_6$ insulated 8D.6 circuit breaker for 145KV 31.5KA, Siemens Review, vol. 43, No. 5, pp. 210-213, May 1976.

Anderson et al., Synthetic Testing of a.c. Circuit Breakers, Proc. IEE, vol. 113, No. 4, Apr. 1966, pp. 611-621.

Primary Examiner—M. Tokar
Attorney, Agent, or Firm—Kenyon & Kenyon

[57] ABSTRACT

An improved synthetic testing arrangement for use in testing a tripolar high voltage circuit breaker wherein the arrangement includes a three-phase high-current source for impressing on the three poles of the breaker breaking currents and arc reactions and a high-voltage load for loading the pole quenching first and the remaining two poles quenching last. In accordance with the invention, the improvement comprises the further provision in such an arrangement of first and second high-voltage sources for influencing the high-voltage load and a switch means for causing the first and second high-voltage sources to be connected into the circuits formed by the three-phase current source and the circuit breaker during a breaking action; the first voltage source being connected so as to load the pole quenching first and the second voltage source so as to load remaining two poles quenching last.

5 Claims, 3 Drawing Figures

4,168,463

ARRANGEMENT FOR THE SYNTHETIC TESTING OF TRIPOLAR HIGH-VOLTAGE CIRCUIT BREAKERS

BACKGROUND OF THE INVENTION

1. Field of the Invention

The invention relates to an arrangement for the synthetic testing of tripolar, and, in particular, metal-enclosed tripolar, high-voltage circuit breakers for use with three-phase networks, wherein the arrangement employs a three-phase high-current source which impresses on the three poles of the circuit breaker breaking currents and arc reactions, and a high-voltage load for loading the pole quenching first and the two poles quenching last.

2. Description of the Prior Art

At 145 kV, synthetic testing circuits are already in use for testing tripolar, particularly, metal-enclosed tripolar, high-voltage circuit breakers of gas-insulated distribution systems for breaking capacity short-circuit capacities. "Siemens-Zeitschrift", 49 (1975) No. 11, page 727 ff describes such a synthetic testing circuit for determining the breaking capacity of a tripolar, metal-enclosed, SF$_6$-insulated circuit breaker, wherein the circuit includes a high-current circuit connected tripolarly to the breaker thereby loading it tripolarly as in the network. In this testing circuit, a high-voltage load is provided for each breaker pole, the conditions for the pole quenching first and for the two poles quenching last being investigate in separate breaking sequences. Due to the necessity of two successive breaking actions for testing each breaker pole, the use of this testing circuit is time-consuming and, hence, undesirable.

It is, therefore, an object of the present invention to provide a synthetic testing circuit for testing a tripolar high-voltage circuit breaker whose operation is less time consuming.

SUMMARY OF THE INVENTION

In accordance with the principles of the present invention the above and other objectives are realized in a testing circuit of the above type wherein a three-phase high-current source is used to impress breaking currents on the poles of the breaker and wherein the circuit further includes first and second high-voltage sources and a switch means for causing the high voltage sources to be connected into the circuits formed by the three-phase current source and the breaker, during a breaking action, the first voltage source being connected so as to load the pole quenching first and the second voltage source the remaining two poles quenching last.

With the testing circuit of the invention so configured, a load commensurate with the network conditions and required by the test specifications is impressed on the circuit breaker being tested in a single breaking process. Moreover, while the circuit requires a second high-voltage source, it must be borne in mind that the test facilities intended for testing electrical high-voltage circuit breakers most likely have available two mutually independent high-voltage circuits, namely one to test the terminal short-circuit and another one to test the gap short circuit. Thus, in actual practice, the present testing circuit may not require the actual addition of an extra source, thereby making the circuit economical.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
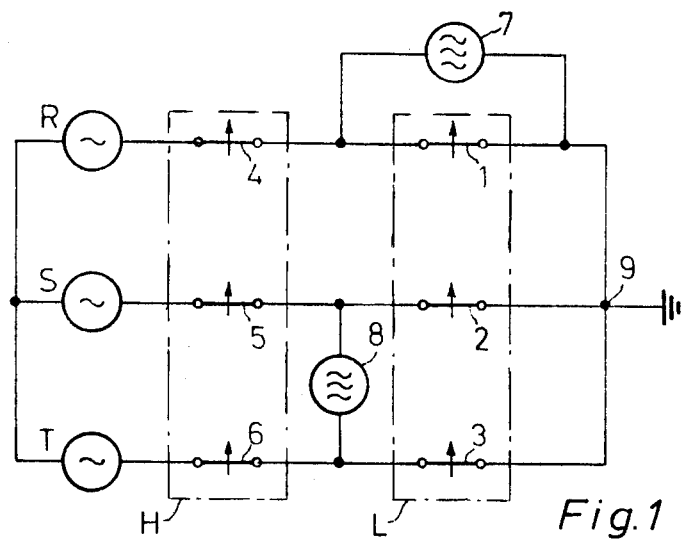
FIGS. 1 and 2 show embodiments of synthetic test circuits in accordance with the principles of the present invention.

FIG. 1 shows synthetic test circuit for testing a tripolar high-voltage circuit breaker L having switching points 1, 2 and 3. The test circuit comprises a three-phase high-current source whose phases R, S, T are connected in series with the switching points 4, 5 and 6 of a tripolar auxiliary switch H. The latter switching points of the switch H when closed are, in turn, series connected to the switching points 1, 2 and 3 of the high-voltage circuit breaker L. The test circuit is further provided with first and second high voltage sources 7 and 8, the former source being connected in parallel with the switching point 1 and the latter source being connected to one end each of the switching points 2 and 3. In testing the breaking capacity of the high-voltage circuit breaker L, the drive controlling the breaker is controlled so that the switching point 1, as the pole quenching first, interrupts the current of phase R. Moreover, both the circuit breaker L to be tested and the auxiliary switch H are actuated simultaneously.

More particularly, when opening all switching points simultaneously, arcs originate in them. The arc current is derived from the high-current soure R, S, T. In operation, the switching points 1 and 4 after opening quench simultaneously first. Thereupon, switching point 1 is loaded by the voltage of the high-voltage circuit 7, the waveform of which corresponds to that of a breaker pole quenching first in the network.

The arcs of the switching points 2, 3, 5 and 6 quench simultaneously ¼ cycle later than the arcs of the switching points 1 and 4. Thereupon, the high-voltage source 8 loads the two switching points 2 and 3, the waveform of the source 8 corresponding to the sum of the absolute values of those waveforms which load the two breaker poles quenching last in the network.

With an otherwise identical configuration of the test circuit for the switching points 2, 3, 5 and 6, it is also possible to arrange the high-voltage source 7 in parallel with the switching point 4 without a different test pattern resulting therefrom.

Figure 2:
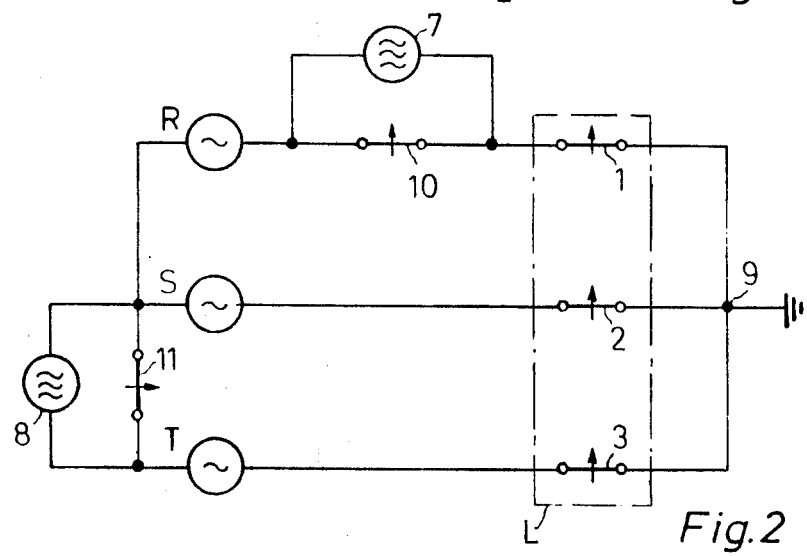

FIG. 2 shows another embodiment of a synthetic test circuit in accordance with the invention wherein the circuit comprises two unipolar switches which are actuated sumultaneously with the switching points 1, 2 and 3 of the high-voltage circuit breaker L. In this circuit, the auxiliary switch 10 is series connected to the phase R of the high current source and to the switching point 1 of the breaker. The switch 10 is also parallel connected to the high-voltage source 7. The auxiliary switch 11, in turn, is located between the terminals of the high-current source phases S and T and away from the switching points to be tested. Connected parallel to the auxiliary switch 11 is the high-voltage source 8.

In the circuit of FIG. 2, the test pattern is the same as that of the circuit of FIG. 1, provided the two unipolar auxiliary switches 10 and 11 are actuated simultaneously A modified embodiment of the test circuit of FIG. 2 results from paralleling the high-voltage source 7 to the switching point 1 of the high-voltage circuit breaker L. In this modified arrangement, the resultant test pattern is the same as in the arrangement of FIG. 2.

Figure 3:
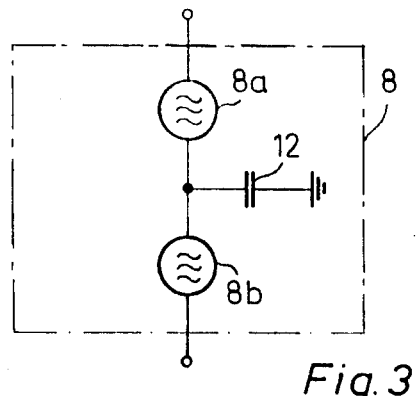
FIG. 3 shows a high voltage source for use in the circuits of FIGS. 1 and 2.

FIG. 3 shows schematically the equivalent circuit diagram of a high-voltage which can be used as the high voltage source 8 of FIGS. 1 and 2. As shown, the high-voltage source is composed of two partial voltage sources 8a, 8b connected in series. The connecting line between the partial voltage sources 8a, 8b is grounded via a capacitance 12.

What is claimed is:

1. In an arrangement for use in synthetic testing of a high voltage circuit breaker, having first, second and third poles, the arrangement including: a high-current source having first, second and third phases for impressing on the three poles of the circuit breaker breaking currents and arc reactions; and a high-voltage load for the pole quenching first and for the remaining two poles quenching last; the improvement comprising:

first and second high-voltage sources for influencing the high-voltage load; and switch means for causing said first and second high voltage sources to be cut into the circuits formed by said these phase high-current source and said circuit breaker during a breaking action, one of said first and second high-voltage sources being cut into such circuits so as to load the first quenching pole and the other of said first and second high voltage sources being cut into such circuits so as to load the remaining two last quenching poles.

2. In an arrangement in accordance with claim 1, the improvement wherein:

said other high voltage source comprises two series connected partial voltage sources whose junction point is at ground potential.

3. In an arrangement in accordance with claim 1, the improvement wherein:

said switch means includes a switch for each of said high voltage sources.

4. In an arrangement in accordance with claim 1, the improvement wherein:

first, second and third lines connect the first second and third phases to said first second and third poles;

said switch means includes first, second and third switches connected in said first, second and third lines, respectively;

said first high voltage source is connected across said pole quenching first;

and said second high voltage source is connected to one end each of said two remaining last quenching poles.

5. In an arrangement in accordance with claim 1, the improvement wherein:

said high current source includes first, second and third generators for generating said first, second and third phases;

first, second and third lines connect said first, second and third generators to said first, second and third poles;

said switch means includes a first switch connected in said first line and a second switch connecting said second and third generators;

and said first and second high voltage sources are connected in parallel with said first and second switches, respectively.

* * * * *